(12) United States Patent
Togawa et al.

(10) Patent No.: US 6,319,105 B1
(45) Date of Patent: Nov. 20, 2001

(54) POLISHING APPARATUS

(75) Inventors: Tetsuji Togawa, Chigasaki; Takeshi Sakurai, Yokohama; Nobuyuki Takada, Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/327,650

(22) Filed: Jun. 8, 1999

(30) Foreign Application Priority Data

Jun. 9, 1998 (JP) .................................................. 10-176580

(51) Int. Cl.[7] .................................................. B24B 29/00
(52) U.S. Cl. ........................ 451/287; 451/444; 451/449; 134/57 R; 134/153
(58) Field of Search .................................. 451/287, 444, 451/449; 134/57 R, 153

(56) References Cited

U.S. PATENT DOCUMENTS

| 5,486,131 | * | 1/1996 | Cesna et al. ............................ 451/56 |
| 5,664,987 | * | 9/1997 | Rentleln ................................. 451/21 |
| 5,836,947 | | 11/1998 | Kimura et al. . | |
| 5,944,894 | * | 8/1999 | Kitano et al. ......................... 118/326 |
| 5,975,994 | * | 11/1999 | Sandhu et al. ........................ 451/56 |
| 6,036,582 | * | 3/2000 | Aizawa et al. ........................ 451/41 |

OTHER PUBLICATIONS

U.S. Patent Application Ser. No. 08/807,810, filed Feb. 26, 1997, by Tetsuji Togawa et al, entitled "Polishing Apparatus", in Group Art Unit 3723, status pending.

* cited by examiner

Primary Examiner—Joseph J. Hail, III
Assistant Examiner—Shantese McDonald
(74) Attorney, Agent, or Firm—Wenderoth, Lind & Ponack, L.L.P.

(57) ABSTRACT

A polishing apparatus includes a cleaning device for critical cleaning of a top ring or a dressing tool to obtain high quality polishing by minimizing surface damage caused by contaminants originating from the top ring and/or dressing tool. The polishing apparatus includes a polishing table; a workpiece holding member for pressing a workpiece onto the polishing table; a dressing tool for conditioning a work surface provided on the polishing table. A cleaning device is provided for cleaning the dressing tool and/or the workpiece holding member. The cleaning device is provided with a spray nozzle for directing a cleaning solution toward at least an upper surface of the workpiece holding member or the dressing tool.

26 Claims, 4 Drawing Sheets

POLISHING APPARATUS

BACKGROUND OF THE INVENTION

1. Field of the Invention

The present invention relates to a polishing apparatus that includes a dressing device to maintain the surface quality of a polishing tool while minimizing polishing defects on a workpiece such as a semiconductor wafer.

2. Description of the Related Art

As the density of circuit integration in semiconductor devices becomes ever higher, circuit patterns are becoming finer and interline spacing narrower. In this type of technology, the depth of focus becomes very shallow in photolithographic reproduction of circuit patterns, and it requires that the surface of the wafer placed at the focal plane of a stepper must be microscopically flat to produce the required degree of image sharpness. As illustrated in FIGS. 4 and 5, a method of obtaining a flat surface is to polish the workpiece in a polishing apparatus comprised by a turntable 12 having a polishing tool 10 such as a polishing cloth or a grinding stone thereon, and a top ring (wafer holding member) 14 known as chemical mechanical polishing (CMP).

In the conventional CMP apparatus, a wafer W is held on the bottom surface of the top ring 14, and the wafer is pressed against the polishing cloth 10 mounted on the rotating polishing table 12 by means of a pressing cylinder. During the polishing process, a polishing solution Q is supplied from a nozzle 16 so that polishing action takes place while the polishing solution Q is retained between the wafer surface to be polished and the polishing cloth 10.

The ability of the polishing cloth 10 to provide efficient surface material removal becomes degraded as polishing is continued, and to regenerate the polishing ability of the polishing cloth 10, a dressing device 18 is used at suitable intervals, such as when exchanging wafers. The dressing device 18 is disposed opposite to the top ring 14 across the center of the turntable 12. The dressing device 18, similar to the top ring 14, may be attached to a swing arm 20 so that it can be swung back and forth between the dressing position above the polishing cloth 10 on the turntable 12 and a standby position outside of the turntable 12. Dressing tool 24 is attached to a shaft 22 at the bottom end of the arm 20, so that it can be driven by an elevating device and a rotation device. A dressing operation is carried out by rotating the turntable 12 and the dressing tool 24 and pressing the dressing tool 24 onto the work surface of the polishing cloth 10.

After dressing is finished, the dressing tool 24 returns to the standby position, but because the tool 24 has been contaminated with polishing debris and polishing solution adhering to the polishing cloth 10, it is necessary that the tool 24 be cleaned before the next cycle of dressing. For this purpose, a cleaning device 28 having a container 26 filled with a cleaning solution L is placed in the standby location, and the dressing surface of the dressing tool 24 is immersed in the cleaning solution L, as shown in FIG. 6. A similar device has also been used to clean the top ring.

However, in such a conventional cleaning device, even if a fresh solution L is used each time, there is always a chance of contamination of the fresh solution L by spent polishing solution or polishing debris that were removed from the dressing tool 24 during the previous cleaning step and are adhering to the inner surface of the container 26. Also, polishing debris adhering to the bottom surface of the dressing tool 24 float into the cleaning solution L, and when the dressing tool 24 is immersed in the cleaning solution L, the solution level rises, the debris will adhere to upper surfaces 24a or side surfaces 24b of the tool 24 (see FIG. 1). Furthermore, mist produced during the normal polishing operation of the polishing solution can sometimes adhere to the upper surfaces 24a or side surfaces 24b of the tool 24, and such a contaminant cannot be removed simply by immersing the tool 24 in the cleaning solution L. such contaminants can sometimes fall on the polishing cloth 10 during the dressing operation. Such dried and solidified contaminants that have fallen on the polishing cloth 10 have been known to cause scratching on the polished surface of the wafer.

SUMMARY OF THE INVENTION

It is an object of the present invention to provide a polishing apparatus to include a cleaning device for critical cleaning of the top ring or the dressing tool to obtain high quality polishing by minimizing surface damage caused by contaminants originating from the top ring and/or dressing tool.

This object is achieved in a polishing apparatus comprising: a polishing table; a workpiece holding member for pressing a workpiece onto the polishing table; a dressing tool for conditioning a work surface provided on the polishing table; and a cleaning device for cleaning the dressing tool and/or the workpiece holding member; wherein the cleaning device is provided with a spray nozzle for directing a cleaning solution toward at least an upper surface of the workpiece holding member or the dressing tool.

Accordingly, the present polishing apparatus enables cleaning the top ring or the dresser in a fresh cleaning solution free of residual contaminants originating from such areas as the solution container, and critically cleaning the upper surface of the workpiece holding device or the dressing tool, which has been difficult to do with conventional cleaning devices. Therefore, the workpiece holding member holding a wafer can now be made totally clean, and the dressing tool can be cleaned thoroughly so that dressing of the polishing cloth can be performed without the fear of contaminating the polishing cloth by particles detached from the dressing tool. The overall result is that superior polishing is achieved by the polishing apparatus of the present invention.

The cleaning device may be provided with a covering member to prevent splashing of cleaning solution. Accordingly, polishing scum and debris are prevented from flying out of the cleaning device so that high pressure sprays can be used to clean the dressing tool or the workpiece holding device.

The cleaning device may be provided with a solution storage section for immersing at least a lower surface of the workpiece holding device or the dressing tool. Accordingly, spray cleaning and immersion cleaning can be combined to provide an even more effective cleaning process.

The cleaning device should be made corrosion resistant in those regions of solution passages and/or solution contacting parts. Accordingly, reactive chemicals which might be needed for cleaning some polishing materials may be used.

The cleaning device may be provided with a control section for controlling operation of the spray nozzle. Accordingly, a most effective cleaning method can be chosen to suit each application.

Therefore, as explained above, the present cleaning device with the spray cleaning produces superior cleaning compared with using immersion cleaning only. Furthermore, an important advantage is the reliability of removing contamination from the upper surface of the workpiece holding device or the dressing tool, which has been a difficult task using the conventional cleaning devices. Therefore, probability of contamination by a dressing tool or a workpiece holding device is reduced significantly, to enable a high quality of polishing on workpieces required for advanced device production.

DESCRIPTION OF THE PREFERRED EMBODIMENTS

Figure 1:
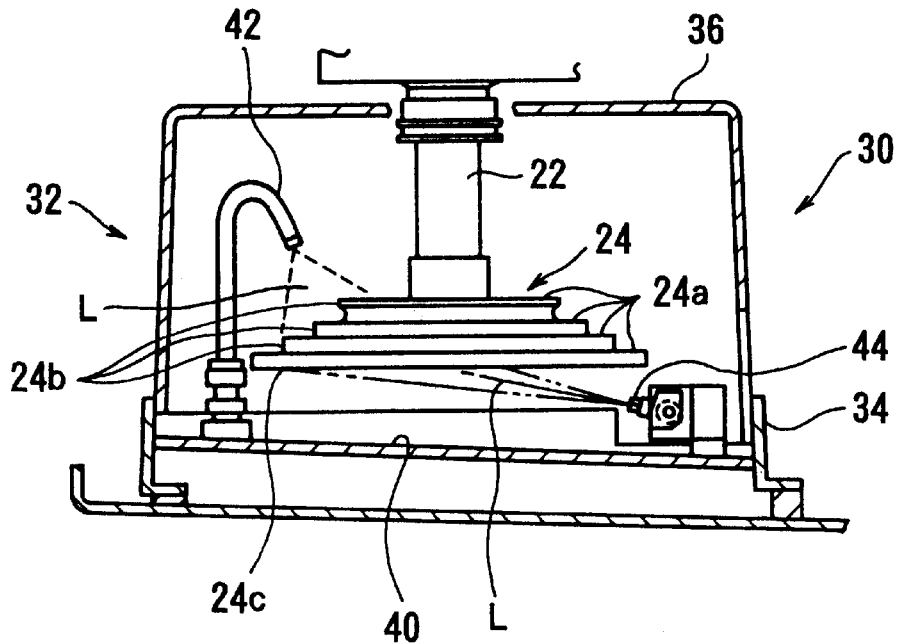
FIG. 1 is a perspective view of an embodiment of the dresser cleaning device in the polishing apparatus of the present invention.
Figure 2:
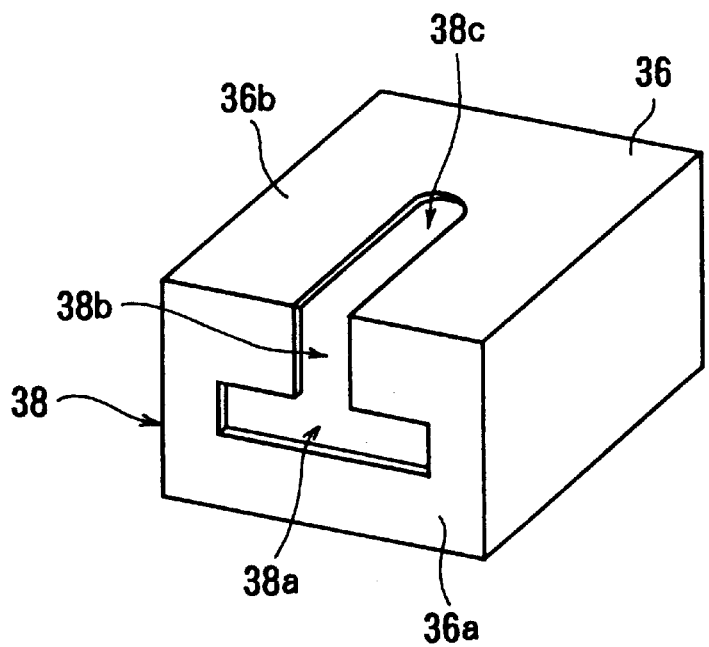
FIG. 2 is a perspective view of an external appearance of a protective covering for the cleaning device shown in FIG. 1.
Figure 3:
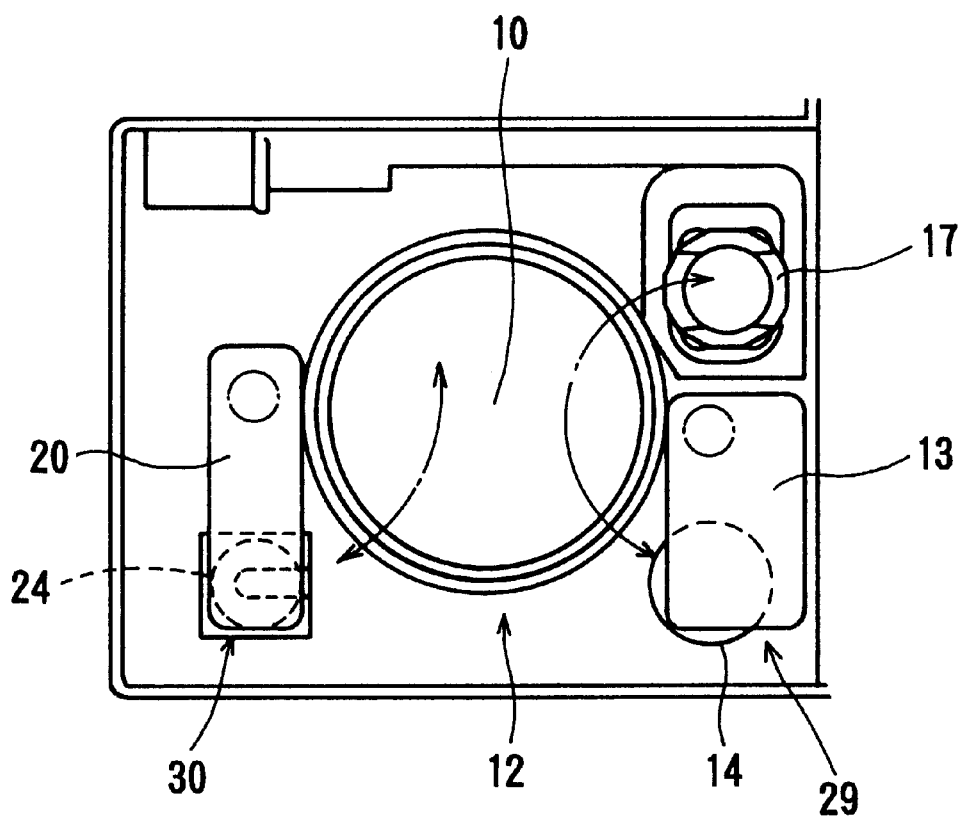
FIG. 3 is a plan view of the polishing apparatus having the dresser cleaning device shown in FIG. 1.

A preferred embodiment of the dressing device will be presented with reference to FIGS. 1 to 3. As shown in such Figures, the dressing device is positioned opposite to the top ring 14 across the center of the turntable 12, and comprises a swing arm 20 swingable in a horizontal plane; a downward extending shaft 22 disposed at the tip end of the arm 20; a dressing tool 24 attached to the bottom end of the shaft 22; and a cleaning device 30, in a standby position outside the turntable 12.

Referring to FIG. 1, the dressing device further comprises a swing mechanism (arm moving mechanism) for swinging the arm 20, and a pressing mechanism (shaft elevating mechanism) for pressing the dressing tool 24 onto the turntable 12. FIG. 3 illustrates that the dressing tool 24 can be moved by the arm 20 to swing between the standby position and a dressing position above the turntable 12. The top ring 14 is similarly provided with a top ring arm 13 and a top ring arm swing mechanism; a shaft 15 and a pressing mechanism; in such a way that the top ring 14 can be moved back and forth freely from a wafer loading position (for loading/unloading the wafer by means of a pusher 17), to the polishing position above the turntable 12, and to waiting position 29.

The dresser cleaning device 30 is housed in a cleaning container 32, shown in FIG. 1, which is comprised by a container body 34 having a sufficient depth to hold a given quantity of liquid at the bottom section, and a detachable protective covering 36. As shown in FIG. 2, the covering 36 is provided with an opening 38, opening both on a side plate 36a and top plate 36b, so as to enable the dresser tool 24 and the shaft 22 to enter into or exit from the covering 36. The opening 38 comprises a wide section 38a for passing the dresser tool 24 or the top ring 14 and narrow sections 38b, 38c for passing the shaft 15 or 22. The opening 38 may be provided with a flap door to prevent the cleaning solution L from splashing outside the covering 36.

An inclined solution discharge path 40 to a exterior drainage by way of a valve is provided on one side of the bottom surface of the container body 34, and serves to operate the container body 34 either in a solution storage mode or in a discharge mode. The container body 34 has at least one first nozzle 42 for spraying the cleaning solution L over the upper surfaces 24a of the dressing tool 24 and at least one second nozzle 44 for spraying the cleaning solution L toward the lower surface of the dressing tool 24. FIG. 1 shows only one nozzle each for the first and second nozzles 42, 44, but more than two nozzles may be placed suitably. The cleaning solution L is delivered to the nozzles 42, 44 under pressure by a solution delivery device and a control device to control the operation of the cleaning device 30, which are not shown in the drawings. The side surface of the tool 24 can be cleaned by sprays from either one or both of the nozzles 42, 44.

Figure 4:
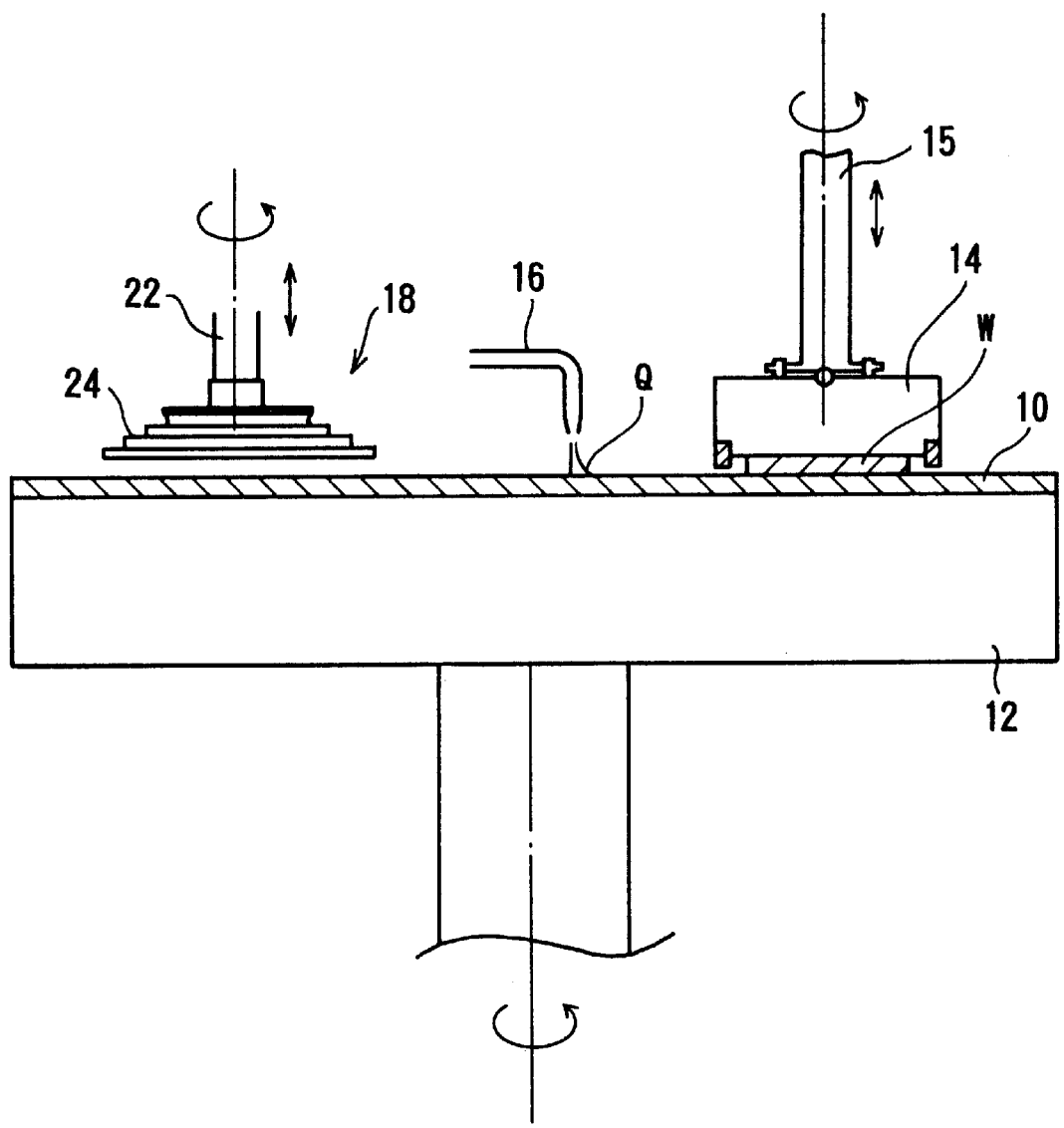
FIG. 4 is a schematic diagram of the polishing apparatus of the present invention.
Figure 5:
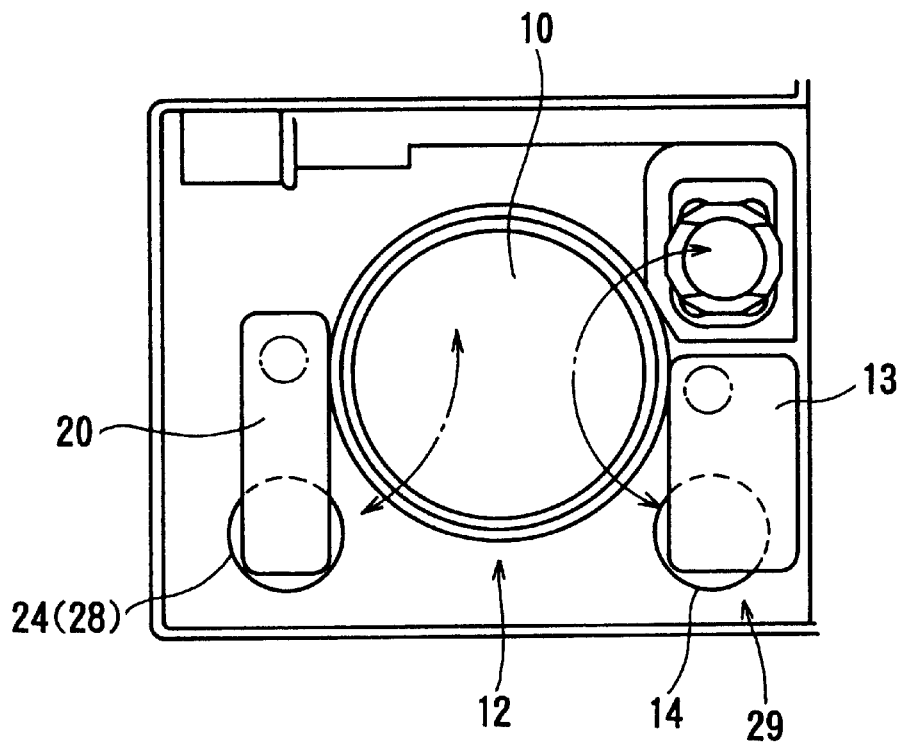
FIG. 5 is a plan view of a conventional polishing apparatus.
Figure 6:
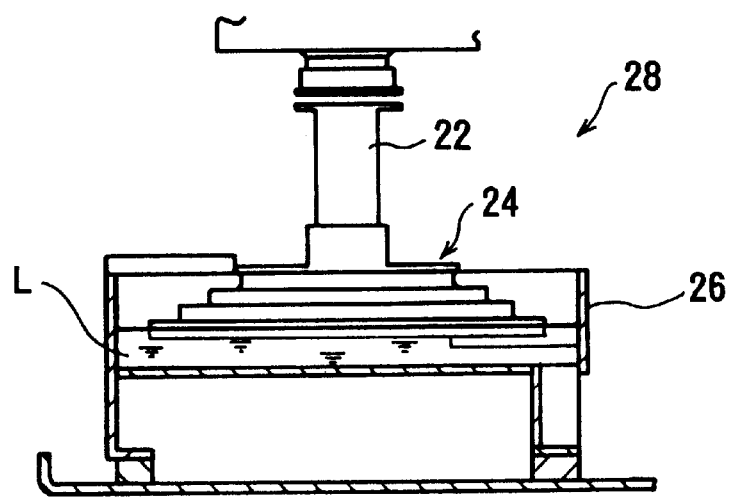
FIG. 6 is a cross-sectional view of the conventional polishing apparatus.

The operation of the dressing device 30 will be explained. As shown in FIG. 4, at the same time as the polishing operation or after the polishing operation is finished, the swing arm 20 is turned to position the dressing tool 24 at a desired spot above the turntable 12, and the shaft 22 is revolved and lowered to press the dressing tool 24 against the polishing cloth 10 to condition the polishing cloth 10.

When the dressing operation is finished, the dressing tool 24 is raised, and the swing arm 20 is swung back to the standby position. When the arm 20 is moved to the standby position, the dressing tool 24 naturally enters into the cleaning device 30 through the opening 38 provided on the covering 36. A given volume of a cleaning solution L such as deionized water is stored beforehand in the container body 34 so that the tool 24 can be immersed in the cleaning solution to perform rough cleaning especially of its lower surface 24c. At this stage, the tool 24 may be rotated or vertically moved in the cleaning solution, as necessary.

Next, the tool 24 is raised to come out of the cleaning solution, and spray cleaning is performed by jetting the cleaning solution from the nozzles 42, 44 at a pressure of about 1 kgf/cm$^2$, as illustrated in FIG. 1. Spray parameters, such as the spray volume, pressure, duration and number of spray nozzles, should be selected appropriately. The tool 24 may be rotated to wash the entire surfaces in accordance with the number or location of the nozzles provided. Polishing scum and debris can be removed with the cleaning solution L by a centrifugal force generated by spinning the tool 24.

The use of spray nozzles 42, 44 for cleaning the tool 24 enables removal of the polishing scum and debris by using a fresh and clean cleaning solution, but it also allows cleaning of the upper surfaces 24a of the tool 24, which has been a difficult task for the conventional cleaning devices. The present dressing device enables the polishing cloth 10 to be dressed with a critically cleaned dressing tool 24, thereby avoiding contamination of the polishing cloth 10 during the dressing operation and enabling achieving high quality polishing. Furthermore, a combination of immersion cleaning and shower spray cleaning by spray nozzles reduces overall cleaning time and the amount of cleaning solution used, and improves the degree of cleanliness of the dressing tool 24.

It is obvious that shower spray cleaning only may be sufficient in some cases. In such a case, a combination of primary cleaning at a high pressure and secondary cleaning at a low pressure may be used. Spray nozzles may be oriented at different angles and used selectively or combined in some suitable manner. Other possibilities include computer control of the cleaning process so that procedures using different nozzles may be programmed in a control application and selected by judging according to sensors or visual observation.

Further, a combined application of different cleaning solutions L may be preferable in some cases, such that primary cleaning is a chemical cleaning process and secondary cleaning employs deionized water for rinsing. If the cleaning solution is corrosive, it is necessary that the liquid passages and the container body 34 should be made corrosion resistant.

When the cleaning process is completed, the dressing tool 24 is returned to the dressing position by swinging the arm 20.

It should be noted that, while the dressing tool is standing-by for the next dressing operation, it is preferable that the dressing tool 24 be kept inside the cleaning container 32 to avoid being splashed by the polishing solution and the like. In such a case, to prevent drying of the dressing tool 24, low-volume sprays from the nozzles 42, 44 may be applied continually or periodically on the dressing tool 24.

Although the above embodiment explained cleaning of a dressing tool, a similar device may be provided for the top ring 14 in the waiting position 29 to remove polishing debris and solution mist adhering to the upper surface of the top ring 14.

What is claimed is:

1. A polishing apparatus comprising:
a polishing table having a work surface;
a workpiece holding member to press a workpiece to be polished onto said polishing table;
a dressing tool to condition said work surface; and
a cleaning device to clean said dressing tool, said cleaning device including a spray nozzle to direct a cleaning solution toward at least an upper surface of said dressing tool.

2. An apparatus as claimed in claim 1, wherein said cleaning device further includes a control to control operation of said spray nozzle.

3. An apparatus as claimed in claim 2, wherein said control is operable to control said spray nozzle to operate at different spray pressures.

4. An apparatus as claimed in claim 2, wherein said cleaning device includes different types of spray nozzles, and said control is operable to achieve cleaning by operating said different types of spray nozzles selectively or in a combined manner.

5. An apparatus as claimed in claim 2, wherein said control includes a sensor to sense contamination on said at least one of said holding member and said dressing tool and to control operation of said spray nozzle based on the thus sensed contamination.

6. An apparatus as claimed in claim 1, further comprising a moving mechanism to transport said at least one of said holding member and said dressing member between a work position on said polishing table and a standby position, and said cleaning device is located at said standby position.

7. An apparatus as claimed in claim 1, wherein said cleaning device includes a cover member to prevent splashing of the cleaning solution.

8. An apparatus as claimed in claim 7, wherein said cover member has an opening configured to a cross-sectional shape of said at least one of said holding member and said dressing tool.

9. An apparatus as claimed in claim 8, wherein said cover member has a movable door at said opening.

10. An apparatus as claimed in claim 1, wherein said cleaning device includes a solution storage section to immerse at least a lower surface of said at least one of said holding member and said dressing tool.

11. An apparatus as claimed in claim 1, wherein said cleaning device is corrosion resistant in at least one of solution passages and solution contacting parts thereof.

12. An apparatus as claimed in claim 1, further comprising a spray nozzle to direct a cleaning solution toward a lower surface of said at least one of said holding member and said dressing tool.

13. An apparatus as claimed in claim 1, further comprising a spray nozzle to direct a cleaning solution toward a side surface of said at least one of said holding member and said dressing tool.

14. A dressing apparatus comprising:
a dressing tool to condition a work surface on a polishing table; and
a cleaning device to clean said dressing tool, said cleaning device including a spray nozzle to direct a cleaning solution toward at least an upper surface of said dressing tool.

15. An apparatus as claimed in claim 14, further comprising a moving mechanism to transport said dressing tool between a work position to be on the polishing table and a standby position, and said cleaning device is located at said standby position.

16. An apparatus as claimed in claim 14, wherein said cleaning device includes a cover member to prevent splashing of the cleaning solution.

17. An apparatus as claimed in claim 16, wherein said cover member has an opening configured to a cross-sectional shape of said dressing tool.

18. An apparatus as claimed in claim 17, wherein said cover member has a movable door at said opening.

19. An apparatus as claimed in claim 14, wherein said cleaning device includes a solution storage section to immerse at least a lower surface of said dressing tool.

20. An apparatus as claimed in claim 14, wherein said cleaning device is corrosion resistant in at least one of solution passages and solution contacting parts thereof.

21. An apparatus as claimed in claim 14, wherein said cleaning device further includes a control to control operation of said spray nozzle.

22. An apparatus as claimed in claim 21, wherein said control is operable to control said spray nozzle to operate at different spray pressures.

23. An apparatus as claimed in claim 21, wherein said cleaning device includes different types of spray nozzles, and said control is operable to achieve cleaning by operating said different types of spray nozzles selectively or in a combined manner.

24. An apparatus as claimed in claim 21, wherein said control includes a sensor to sense contamination on said dressing tool and to control operation of said spray nozzle based on the thus sensed contamination.

25. An apparatus as claimed in claim 14, further comprising a spray nozzle to direct a cleaning solution toward a lower surface of said dressing tool.

26. An apparatus as claimed in claim 14, further comprising a spray nozzle to direct a cleaning solution toward a side surface of said dressing tool.

* * * * *